(12) United States Patent
Dahl

(10) Patent No.: US 6,952,375 B2
(45) Date of Patent: Oct. 4, 2005

(54) SELF-TIMED VOLTAGE-SUBTRACTION SNEAK CURRENT CANCELLATION METHOD AND APPARATUS

(75) Inventor: Hans Ola Dahl, Stange (NO)

(73) Assignee: Intel Corporation, Santa Clara, CA (US)

(*) Notice: Subject to any disclaimer, the term of this patent is extended or adjusted under 35 U.S.C. 154(b) by 377 days.

(21) Appl. No.: 10/322,292

(22) Filed: Dec. 17, 2002

(65) Prior Publication Data

US 2003/0120965 A1 Jun. 26, 2003

Related U.S. Application Data

(63) Continuation-in-part of application No. 10/035,878, filed on Dec. 24, 2001.

(51) Int. Cl.[7] .................................................. G11C 7/02
(52) U.S. Cl. .................. 365/210; 365/45; 365/189.07; 365/189.09; 365/202; 365/207; 365/233
(58) Field of Search ............................ 365/210, 189.07, 365/189.09, 45, 202, 233

(56) References Cited

U.S. PATENT DOCUMENTS

| | | | | |
|---|---|---|---|---|
| 5,450,361 A | * | 9/1995 | Iwahashi et al. | 365/200 |
| 6,055,180 A | | 4/2000 | Gudesen et al. | |
| 6,198,678 B1 | * | 3/2001 | Albon et al. | 365/203 |
| 6,236,605 B1 | * | 5/2001 | Mori et al. | 365/205 |
| 6,323,693 B1 | * | 11/2001 | Park | 327/56 |
| 6,434,068 B1 | * | 8/2002 | Harada et al. | 365/201 |
| 6,570,440 B1 | * | 5/2003 | Chow et al. | 327/545 |
| 2003/0016564 A1 | * | 1/2003 | Schramm et al. | 365/189.07 |

* cited by examiner

Primary Examiner—Hoai Ho
Assistant Examiner—Ly Duy Pham
(74) Attorney, Agent, or Firm—Marger Johnson & McCollom (57) ABSTRACT

A single bit line reference signal path or line is used for both voltage subtraction and self-timing of a second sense that is longer than a first sense in a dual-sense, single-read memory cell. The self-timing mechanism includes an analog circuit.

15 Claims, 6 Drawing Sheets

SELF-TIMED VOLTAGE-SUBTRACTION SNEAK CURRENT CANCELLATION METHOD AND APPARATUS

RELATED APPLICATIONS

The present application is a continuation-in-part of U.S. patent application Ser. No. 10/035,878, filed Dec. 24, 2001.

BACKGROUND OF THE INVENTION

1. Field

This disclosure relates to passive electronic devices, and more particularly to passive electronic devices that are subjected to applied voltages. Even more particularly, it is related to voltage subtraction and timing circuits used with sneak current cancellation in dual-sense, single-read memory devices.

2. Background

Passive electronic devices generally do not generate signals based upon their own internal circuits. Typically, passive devices must be addressed or requested to provide some sort of signal. One example of a passive device is a memory. Generally, memories do not provide the data stored in them until some other device, such as a processor, requests the data. Similarly, the memory receives data to store, rather than generating data to store.

Some types of passive devices, including memories, have elements being held at a potential, even though those elements may not be undergoing active addressing. Returning to the memory example, a memory cell may be held at a particular potential in order to allow the cell to retain the data stored there. This potential is typically less than that required to address a cell for either reading or writing.

However, application of the voltage may cause the cell to 'leak' charge over a period of time, resulting in a low level of current. While the current created by any one element does not cause problems, when multiplied by the number of elements in the device, the current could become one. The cumulative charge over time becomes a significant current, referred to here as 'sneak' current, and results in a high level of noise in the signal.

It would be desirable for a method and apparatus that could cancel the sneak current, reducing the noise in the system utilizing the passive electronic devices.

BRIEF DESCRIPTION OF THE DRAWINGS

The invention may be best understood by reading the disclosure with reference to the drawings, wherein.

DETAILED DESCRIPTION OF THE PREFERRED EMBODIMENT

Figure 1:
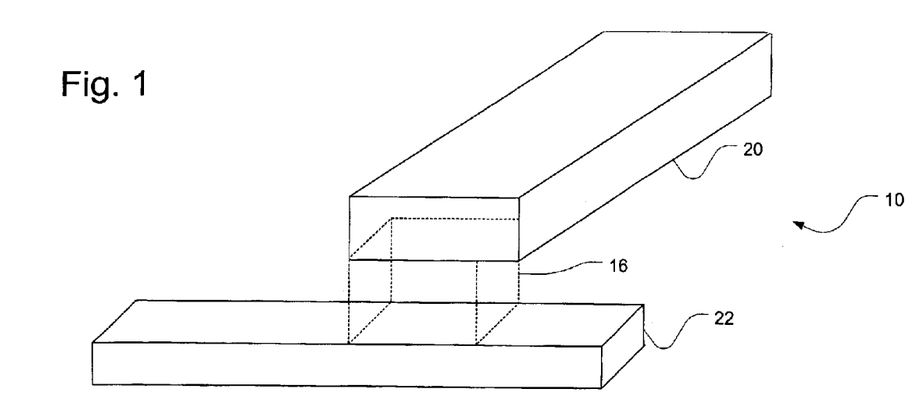
FIG. 1 shows an embodiment of a passive electronic device.

FIG. 1 shows one example of a cell in a ferroelectric memory array. The cell 10 has an electrode layer 22, a ferroelectric material layer 16 and a second electrode layer 20. This cell may be manufactured by depositing and patterning a layer of metal, spinning on a polymer and then depositing and patterning another layer of metal. There are no transistors or other semiconductor elements in each cell, simplifying both the structure and the manufacturing process of these types of memories.

The electrode layers 20 and 22 are typically organized such that one forms a series of lines oriented in a first direction and the other forms a series of lines in a direction at a right angle to the first direction. Although these lines are separated by the ferroelectric material, they do cross over, forming the grid of memory cells. The region of ferroelectric material 16 sandwiched between the two lines at the crossover point shown in FIG. 1 is the portion of the cell that holds the data value as will be discussed in more detail below.

Figure 2:
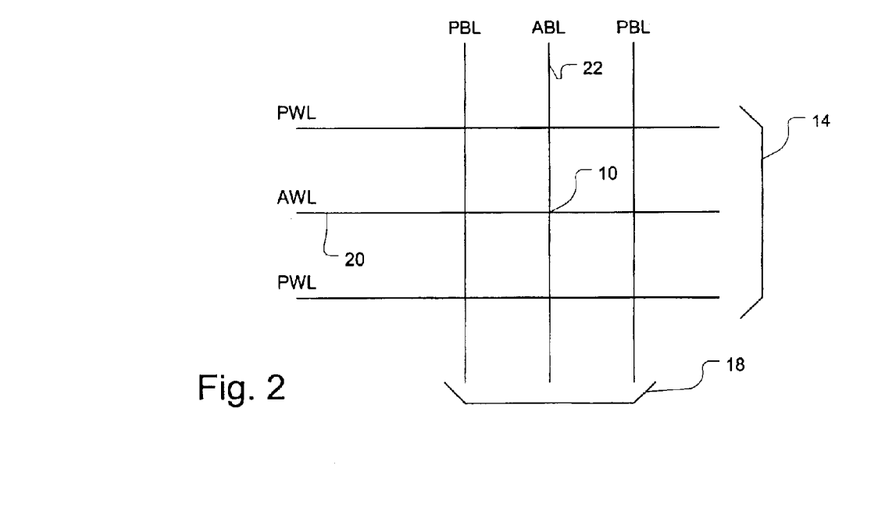
FIG. 2 shows an embodiment of an array of memory cells, in accordance with the invention.

FIG. 2 shows a portion of a memory array formed of such cells. The electrode line 20 from FIG. 1 is defined as a word line and the electrode line 22 as the bit line. The cell 10 is at the crossover point of these two lines and in this example is the active cell. The active cell for the purposes here is that cell which is being addressed in a memory operation, either a memory read or a memory write. Correspondingly, the word line 20 is defined as the active word line (AWL) and word line 22 is defined as the active bit line (ABL). The word and bit lines surrounding the active cell are referred to as passive word lines (PWL) and passive bit lines (PBL).

Figure 3:
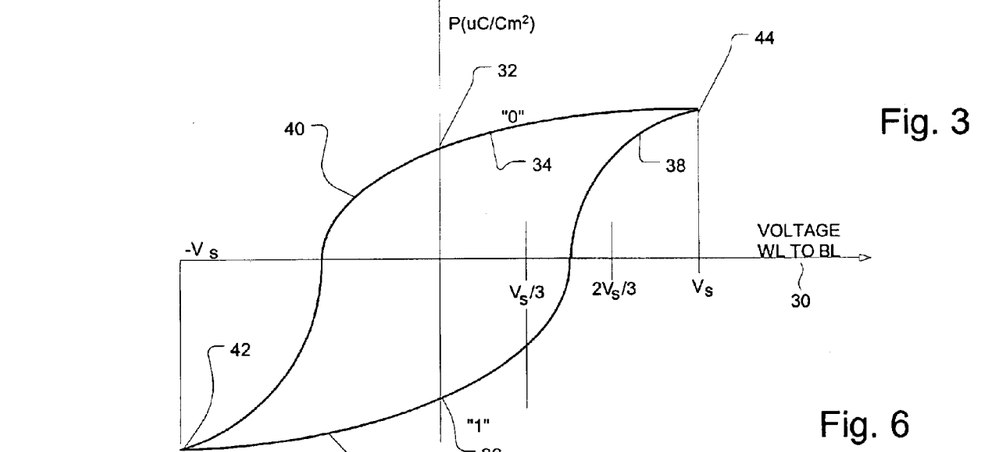
FIG. 3 shows a voltage versus polarization hysteresis curve, in accordance with the invention.

The data value in the cell is either a one '1' or a zero '0'. The value of the cell is determined by the polarization of the material versus the voltage being applied. Referring now to FIG. 3, a polarization versus voltage hysteresis curve demonstrates the nature of the memory cell and how it stores data values of ones or zeros. Control of the voltages applied to the active word line and active bit line may cause the material to experience a polarization shift. The differential voltage seen at the cell is referred to as the word line to bit line voltage, and is shown in the curve of FIG. 3 as the horizontal axis. The vertical axis is the polarization of the material. The origin of the axes corresponds to zero voltage and zero polarization. FIG. 3 shows a typical polarization versus voltage curve.

When a negative voltage $-V_s$ is applied to the word line 20 relative to bit line 22, the polarization versus voltage profile follows the left path 40. This occurs as the polarization of the ferroelectric material switches from positive to negative polarity. Changes in polarization take time and eventually the polarization settles at the polarization level corresponding to the negative saturation voltage $-V_s$, as shown at the bottom of the leftmost path at 42. When the magnitude of the applied voltage is reduced, e.g. to zero along path 35, the material retains a remnant polarity shown as a data value "1" on the vertical axis at 36.

Similarly, when a positive saturation voltage $V_s$ is applied to word line 20 relative to bit line 22, the polarization versus voltage profile follows the right side path 38, settling at the polarization level corresponding to the positive saturation voltage, as shown at the top of the rightmost path at 44. When the magnitude of the applied voltage is reduced, e.g. to zero along path 32, the material retains a remnant polarity shown as a data value "0" on the vertical axis at 34.

In order to determine the current state of polarity of a cell, the saturation voltage $V_s$ is applied to the ferroelectric cell.

This means that the word line to bit line voltage differential is $V_s$. This application causes a polarization shift. For the data value zero, where the cell has positive polarity at zero voltage, application of the saturation voltage produces lit to no charge out. Sense amplifiers assigned to that cell detect no charge release. This lack of charge release is then manipulated to produce a data value of 'zero' for that memory cell in the read operation. However, application of the saturation voltage to the cells having negative polarity at zero voltage does cause a polarity reversal and an associated charge release. This charge release is sensed and manipulated to produce a data value of 'one' for that memory cell in the read operation.

One characteristic of this type of memory is that cells coupled to the active bit line experience a voltage potential of $V_s/3$. Cells in the 'one' state release a residual amount of charge to provide a "sneak current" to the active bit line. In one embodiment of the present invention, a residual charge release of 0.08 femto-coulombs per square micrometer (0.08fC/$\mu m^2$), per memory cell, is expected for propagation to the active bit line. Assuming, for example, that 2048 ferroelectric cells are tied to the active bit line and a worst case condition of each cell having a one state condition, then the combined "charge" propagated to the active bit line could be as large as 164fC/$\mu m^2$. This charge may lead to a false reading of the memory cell, as it essentially acts as 'noise' on the line.

Figure 4:
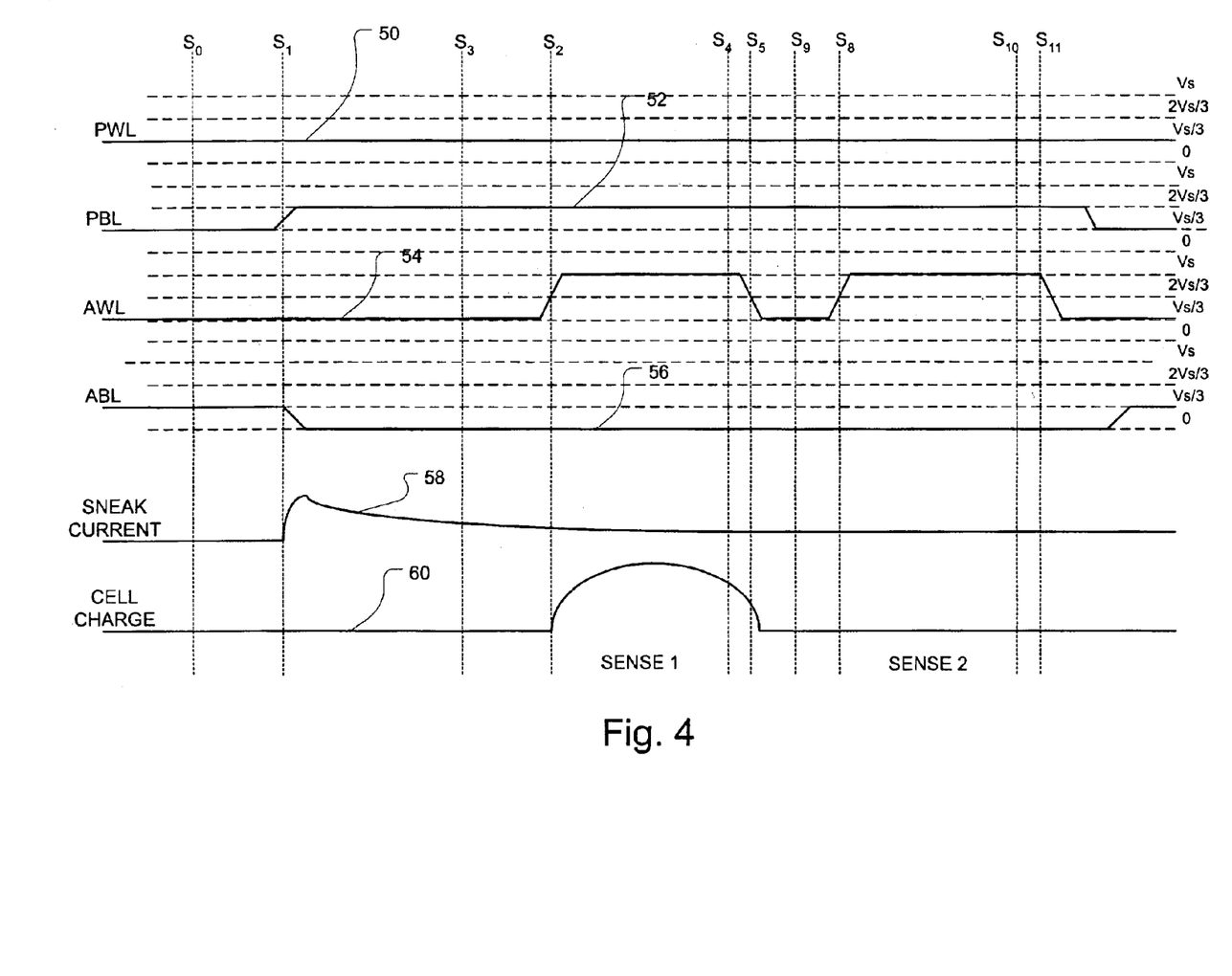
FIG. 4 shows a timing diagram of a single read, dual sense read cycle, in accordance with the invention.

A timing diagram for a single read, dual sense, read cycle is shown in FIG. 4. As can be seen, the four different types of data lines are shown on the timing diagram, being passive word lines (PWL), passive bit lines (PBL), active word lines (AWL) and active bit lines (ABL). In addition, a waveform for a sneak current and the cell charge are also shown. As can be seen, the word and bit lines are held at a potential of $V_s/3$, prior to the beginning of the cycle.

At time $S_0$, as shown in the timing diagram of FIG. 4, the word lines and bit lines receive quiescent level voltages of $V_s/3$. A sneak current 58 is then drawn from the active bit line after charging the passive bit lines to voltage levels of $2V_s/3$ and discharging the active bit line to zero volts, as represented by waveforms 52, 56 at snapshot time $S_1$ in FIG. 4. In this embodiment, a bit line settling duration is provided before starting a first integration interval. After the time for the sneak current to reach a substantially linear region of its settling curve, the integration sense amplifier is enabled at snapshot time $S_3$, to begin a first integration time window. Next, the active word line is charged to a read level voltage equal to the saturation level $V_s$ as represented by waveform 54 at time $S_2$. The integrating sense amplifier integrates charge released from the active ferroelectric cell. Upon conclusion $S_4$ of the first integration window, a first integration value is obtained from the integration sense amplifier.

After obtaining the first integration value, the integration sense amplifier is disabled and the active word line returned to its quiescent voltage level of $V_s/3$, as represented by waveform 54 at snapshot time $S_5$. Another duration is allowed to lapse, during which the active ferroelectric cell is allowed to establish a zero state remnant polarization condition, and then the integrating sense amplifier is again enabled to start the second integration window at time $S_9$, and the active word line is driven to a read level voltage equal to the saturation level voltage $V_s$, see waveform 54 at time $S_8$. Over this second integration duration, residual charge released from the ferroelectric cell, e.g. that associated with any residual polarization alignments, is integrated by the integration sense amplifier.

At the conclusion of the second integration time window, at time $S_{10}$, a second integrated value is obtained from the sense amplifier, and the first and second integration values are compared in order to determine the initial state of the ferroelectric cell. Following the second integration time window, the active word line is returned to its quiescent level voltage $V_s/3$ as represented by waveform 54 at time $S_{11}$, and the active and passive bit lines returned to their quiescent level voltages of $V_s/3$, as represented by waveforms 56, and 52.

Figure 5:
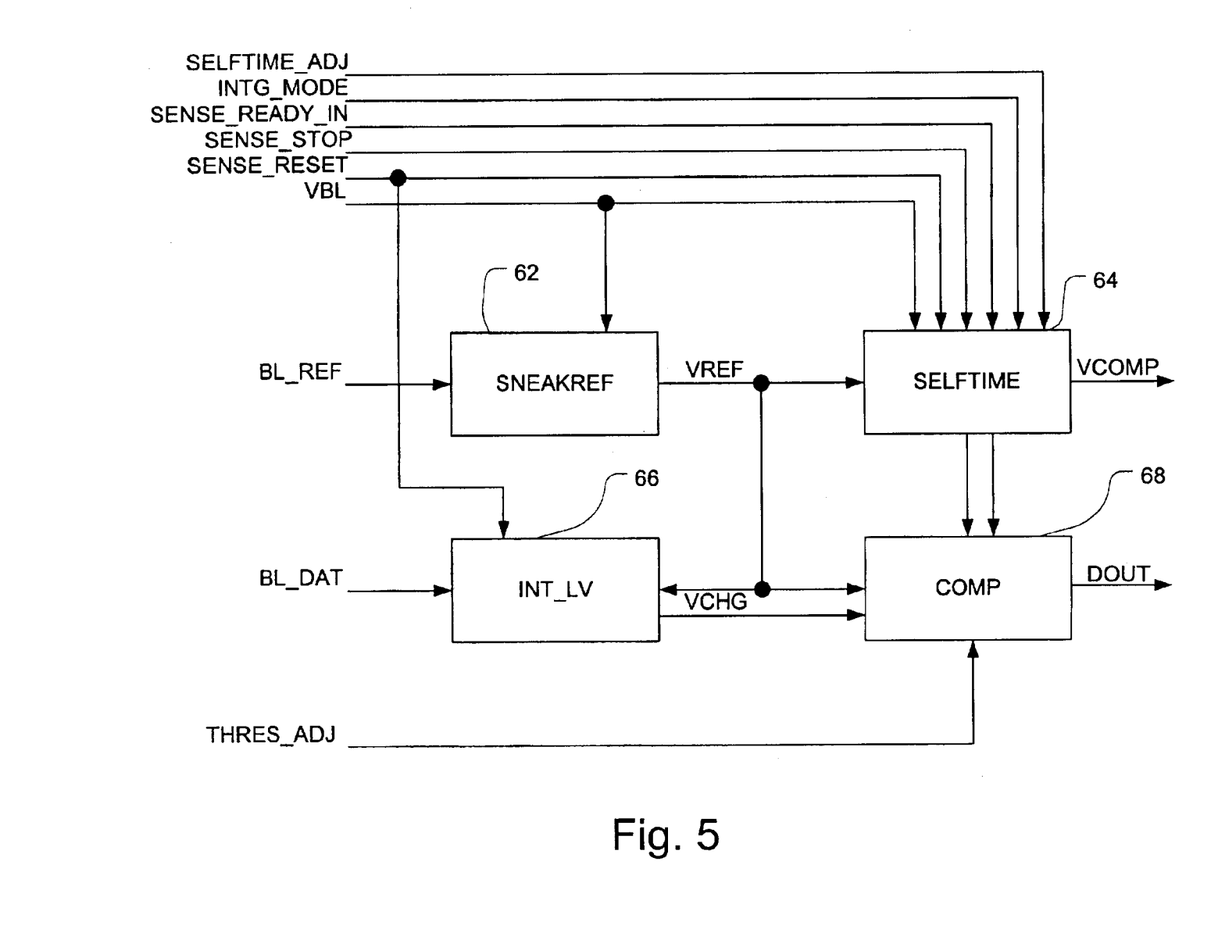
FIG. 5 shows an embodiment of a sense and interpretation circuit, in accordance with the invention.

In order to eliminate the problems associated with the sneak current, different approaches may prove useful. One such approach is shown in block diagram form in FIG. 5. In this embodiment, the circuit shown in FIG. 5 is used to sense and interpret the polarization charge release from an addressed pixel during a read cycle. As part of the read cycle, the circuit mitigates the effects of the sneak current by way of both of two independent means: voltage subtraction and self-timing.

As can be seen in FIG. 5, the sense and interpretation circuit has four functional blocks in this embodiment. The SNEAKREF module 62 senses the sneak current on a reference bit line BL_REF and generates a compensation voltage VREF that is proportional to the sneak charge. The integrator, INT_LV, 66 senses the charge release on the addressed bit line BL_DAT and subtracts therefrom the sneak charge sensed on the reference bit line BL_REF. Based upon the principle that the sneak current or charge on BL_REF and BL_DAT are approximately equal, such voltage subtraction should cancel all or at least substantially all sneak current.

The integrator 66 produces an output voltage VCHG proportional to the voltage difference. This voltage difference is sampled by a comparator COMP 68 at the end of each of two successive integration windows, and the two results are subtracted. The threshold of COMP 68 is set by THRES_ADJ and COMP 68 produces a digital output signal DOUT representing whether VCHG (data minus sneak) is a "1" or a "0".

The integration mode signal INTG_MODE controls the timing of the integrators to handle sneak current using the SELFTIME module 64. The SELFTIME module 64 has an input of VREF, which is produced by the SNEAKREF compensation module 62.

Figure 6:
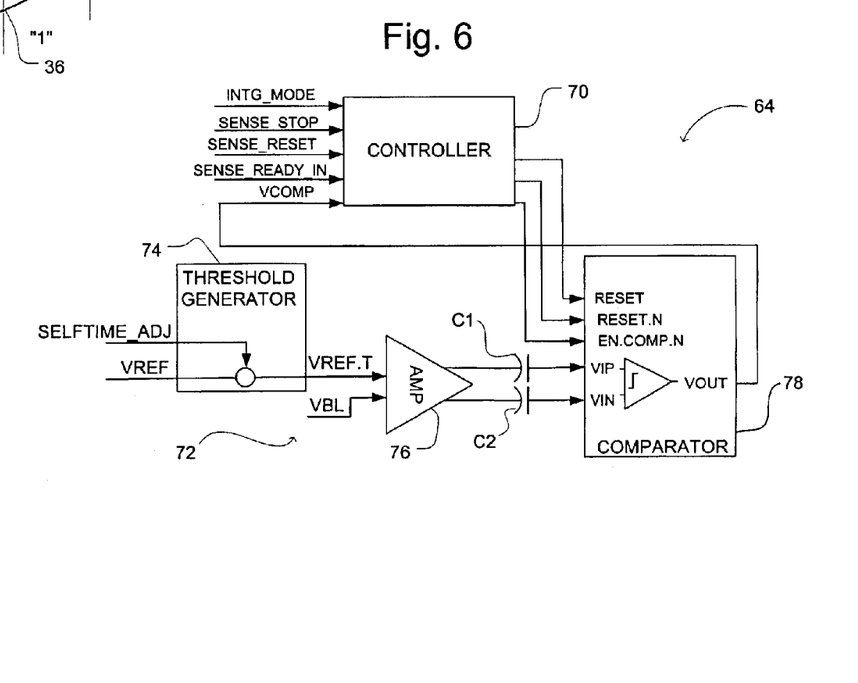
FIG. 6 shows an embodiment of a voltage subtractor and self-timing circuit including an analog circuit, in accordance with the invention.

A detailed embodiment of the SELFTIME module 64 is shown in FIG. 6. Those of skill in the art will appreciate that SELFTIME module 64 represents an alternative—or in accordance with a preferred embodiment of the invention, an additional—means of canceling sneak charge, thus providing insurance in addition to the above-described voltage subtraction that sneak charge does not adversely affect a device read operation. SELFTIME module 64 does so by ensuring that the sneak charge is approximately equal in each of the successive integration windows. (If the sneak charges in successive windows are equal, they will cancel out when subtracted.) Thus, comparator module COMP 68 samples the integrator output VCHG at the end of each integration window and subtracts the two results. The part of VCHG that derives from sneak charge cancels out.

The SELFTIME module 64 has two different parts, a digital controller 70 and an analog circuit portion 72. Analog circuit portion 72 includes a threshold generator 74, a self-time op amp 76, two capacitors C1, C2 and a comparator 78. Controller 70 decodes the integration mode signal INTG_MODE and generates the corresponding control signals. SELFTIME module 64 with analog circuit portion 72 establishes the timing between the first and second sense phases (SENSE1 and SENSE2 of FIG. 4) of the integration and thereby determines when to stop the integration of the VREF signal used to detect the polarization state of the addressed cell. SELFTIME module 64 monitors VREF to determine when the sneak charge on the reference line BL_REF has reached a given threshold and then stops the integration.

The threshold generator 74 generates VREF.T from VREF based upon a bias control signal SELFTIME.ADJ, which may vary. The level of VREF.T into self-time op amp 76 may be externally adjustable by any suitable means. Self-time op amp 76 amplifies any difference between VREF.T to the bit line voltage VBL and outputs a differential input voltage through identical, matched coupling capacitors C1, C2 to the positive and negative inputs of comparator 78, respectively. VREF may be seen as containing two components: VBL+VSNEAK. VBL is a fixed "bias" voltage, whereas VSNEAK is produced by sneak currents. The threshold generator 74 subtracts from VREF an adjustable threshold voltage, referred to herein as VTHRES, thus producing VREF.T=VSNEAK+VBL−VTHRES.

Because the difference between VREF.T and VBL, i.e. VREF.T−VBL, equals VSNEAK−VTHRES, the differential input voltage to AMP 76 is equivalent to the difference between the accumulated sneak charge on the BL_REF line and the threshold generated by the THRESHOLD GENERATOR 74.

When integration begins, this differential input voltage equivalent to VSNEAK−VTHRES is less than zero, but when the threshold (set by SELFTIME_ADJ) has been exceeded, this voltage is greater than zero. Thus, the AMP 76 effectively amplifies VSNEAK−VTHRES and couples it to the COMPARATOR 78. When the COMPARATOR 78 detects that the coupled input equivalent to VSNEAK−VTHRES has crossed zero volts, it responds by setting VCOMP to a logic "1". This in turn causes the CONTROLLER 70 to stop the integration (via the RESET/RESET.N control signal pair). Thus, the SELFTIME module 64 stops the integration when the sneak charge has reached a threshold value controlled by the voltage on SELFTIME_ADJ.

(The SELFTIME module 64 can operate in a second mode as well as that described above. The selected mode is controlled by the INTG_MODE signal. In the other mode, the THRESHOLD GENERATOR 74 is disabled, i.e. VREF.T=VREF. Instead of waiting for the sneak charge on BL_REF to reach a threshold, the CONTROLLER stops the first integration when it detects a "0" to "1" transition on SENSE_STOP. Referring to the voltage on VREF when this happens as VREF1, it may be seen that, during the second integration, the COMPARATOR will set VCOMP to a "1" when VREF again reaches VREF1, i.e. when the sneak charge reaches the same value as it did at the end of the first integration window. Those of skill in the art will appreciate that, in this alternative mode of operation, the SELFTIME module 64 uses capacitors C1 and C2 to store VREF1 (AMPlified).) After the CONTROLLER 70 resets the comparator via the positive and negative RESET, RESET.N inputs, it enables comparator 78 by asserting an enable signal EN.COMP.N (low active). The COMPARATOR 78 thus produces a logic signal VCOMP at its output terminal VOUT that transitions from a "0" to a "1" when the comparator detects that the sneak charge has reached a defined threshold. VCOMP is an input to digital controller 70 that causes controller 70 to reset comparator 78 at the end of the dual-sense operation while automatically extending the period of the second sense to a value slightly greater than that of the first sense. Thus the invention automatically compensates, via analog circuit portion 72, for the slightly declining sneak current that typifies data storage cells (refer to the sneak current trace in FIG. 4, discussed above). It does so because the SELFTIME circuit 64 automatically slightly extends the duration of the second of two successive sense windows.

It will be appreciated that a single reference line VREF is used to control both voltage subtraction (in the INT_LV 66 module) and self-timing (in the SELFTIME module) of the second sense operation. This results in reduced memory array surface area and routing density. It also will be appreciated that the single reference line VREF preferably is shared among several data bit lines. In one preferred embodiment there are eight BL_DAT signal lines per BL_REF signal line. As a consequence, one SNEAKREF and one SELFTIME module is combined with eight INT-LV and eight COMP modules.

Figure 7:
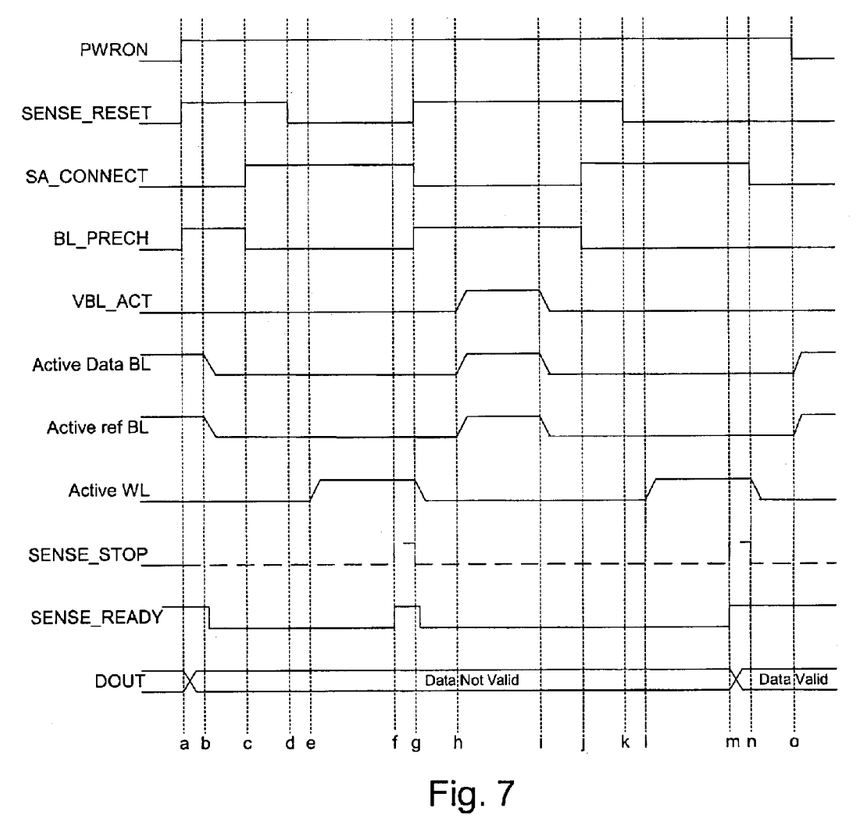
FIG. 7 shows a timing diagram for the embodiment of FIG. 6, in accordance with the invention.

A timing diagram of the embodiment of FIG. 6 is shown in FIG. 7. Referring now to FIG. 7, the interaction between self-timed sneak current cancellation and a read cycle may be better understood. Generally, a sample of the integrators is taken when VREF has reached the threshold voltage. In the single-read, dual-sense mode discussed with regard to FIG. 4, the second sample is taken when VREF reaches a voltage level substantially equal to that taken during the first sensing interval. The second integration typically may take slightly longer than the first, as described above. A read signal, SENSE_READY_OUT, is generated each time a sample is taken. In addition, there is a timeout function that may cause the sample to be taken before the threshold is reached. The sample taken is of the output voltage of the integrators.

In FIG. 7, the various signals in the timing diagram are as follows. Some of these are not shown in FIG. 6, as they are control signals to the various components of the circuit and are believed to be self-explanatory.

| Signal Name | Description |
| --- | --- |
| PWRON | Power up signal |
| SENSE_RESET | Reset signal for the integrators |
| SA_CONNECT | Connect the integrators to the bit lines and the SNEAKREF module to the reference bit line |
| BL_PRECH | Precharge signal for the reference bit line |
| VBL_ACT | Voltage on the active bit line |
| Active data BL | Bit line being addressed |
| Active ref BL | Active reference bit line |
| Active WL | Word line being addressed |
| SENSE_STOP | Timeout signal |
| SENSE_READY | Signal indicating a sample is to be taken from integrators |
| DOUT | Data out |

The relevant points of time in the timing diagram of FIG. 7 are designated with a lower case letter.

At 'a' the sense amplifiers are powered up and the integrators enter their reset state. The active bit line and the reference bit line are precharged to the voltage on the VBL_ACT. At 'b' the column strobe connects the addressed bit line to BL_DATA and BL_REF lines. At 'c' the precharge period ends and the BL_DATA and BL_REF lines are connected to the amplifiers.

Integration starts as the integrators exit their reset state at 'd.' The addressed word line is then switched to $V_s$ to allow the full switching potential to lie across the addressed cells of the memory array at 'e.' At 'f' the sneak charge on the reference bit line has reached the threshold, or the SENSE_

STOP signal is triggered by a timeout. SENSE_READY is set high and the comparator samples the output of the integrator.

At points 'g', and 'h', the process resets to allow the second sensing period to commence. At 'g' the BL_DAT and BL_REF lines are disconnected from the amplifiers and the integrators are reset. The addressed word line is also switched back. At 'h' VBL_ACT is switched to a dwelling voltage and BL_DAT and BL_REF follow.

The second sensing period commences at 'i' when VBL_ACT returns to its inactive state, and BL_DAT and BL_REF follow. For purposes of this discussion, and as shown in FIG. 4, the inactive state for VBL_ACT is assumed to be zero volts. However, there may be a bias voltage applied, VBL. The points 'k,' 'l,' and 'm' correspond to points 'd,' 'e,' and 'f'. The process cycles down at 'n' when BL_DAT and BL_REF are disconnected from the amplifiers and the addressed word line is switched back. Finally, at 'o' the sense amplifiers power down, the column strobe turns off and the bit lines return to the quiescent voltage.

In this manner the sneak current is cancelled by self-timing the integration periods to ensure that VCHG contains substantially only data and virtually no sneak contribution. Accordingly, the possibility of a false reading of the data from a memory cell is greatly mitigated. As a final safeguard, the results of the two sensing operations are subtracted to ensure that all influences of the sneak current are eliminated before the data is 'read.'

Two important aspects of the circuit described above for use in a memory such as a cache memory may now be summarized. A self timing circuit (SELFTIME 64) times the duration of the first and second integration windows so the sneak charge will be the same in each. Thus, the sneak charge will cancel out when the results from the two windows are subtracted. The same reference bit line (BL_REF) is used for both self timing and voltage subtraction. If all the circuits worked ideally, and if the BL_DAT and BL_REF lines were perfectly matched, it would be sufficient to have either voltage or self timing. In the real world, nothing is ideal or perfect, and so in accordance with a preferred embodiment of the invention, the two techniques work together to produce a nearly optimal sneak charge-cancellation result. Those of skill in the art will appreciate that circuits embodying either or both self timing and voltage subtraction techniques are contemplated as being within the spirit and scope of the invention.

A system utilizing the above-described memory now will be described by reference to FIG. 8. The system may be seen preferably to include a processor 80 and one or more peripheral input/output devices such as mouse/keyboard/printer/peripheral/etc. device 82. The system preferably includes a hard disk memory 84 and an associated cache memory 86, the last being constructed in accordance with the invention described above by reference to FIGS. 1 through 7.

(A hard disk is part of a unit, often called a disk drive, hard drive or hard disk drive that stores and provides relatively quick access to large amounts of data on an electromagnetically charged surface or set of surfaces. Modern computers typically come with a hard disk that contains several billion bytes (gigabytes or GB) of storage.

(A hard disk is actually a set of stacked disks each of which, like phonograph records, has data recorded electromagnetically in concentric circles or tracks on the disk. A head (something like a phonograph arm and stylus, but in a relatively fixed position) records (writes) or reads the information on the tracks. Two heads, one on each side of a disk, read or write the data as the disk spins. Each read or write operation requires that data be located, which is an operation called a "seek." (Data already in a disk cache, however, can be located much more quickly.)

(A hard disk/drive unit comes with a set rotation speed varying from 4500 to 7200 revolutions per minute (rpm). Disk access time is measured in milliseconds. Although the physical location can be identified with cylinder, track and sector locations, these are actually mapped to a logical block address (LBA) that works with the larger address range on modern hard disks.)

Figure 8:
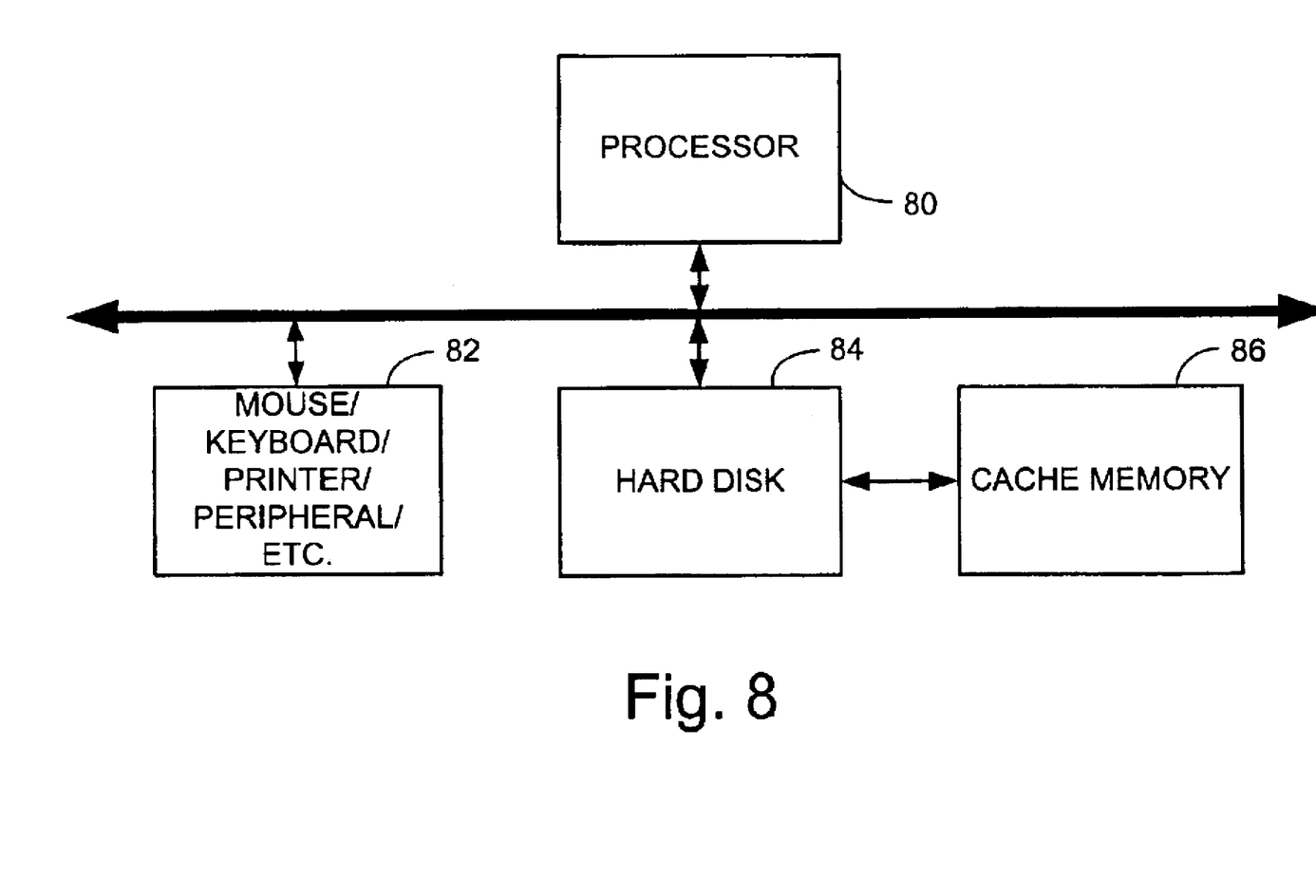
FIG. 8 is a system block diagram showing a use to which the invented device may be put.

Those of skill in the art will appreciate that the system illustrated in FIG. 8 itself may take any suitable form. For example, the system including the cache memory may be used in a variety of applications including a personal digital assistant (PDA), digital music player, digital camera, two-way pager, wireless telephone, personal computer (PC), laptop computer, desktop computer, workstation, server, video or other device or equipment.

Moreover, those of skill in the art will appreciate that cache memory 86 itself may be used as a system memory, without association or connection with a hard disk memory such as memory 84. Cache memory 86 also may be used as a mass storage memory or as a cache memory for a system memory. Cache memory 86 may be used to cache any disk memory, e.g. hard disks, optical disks, electromechanical disks, magnetic-optical disks and/or other disk subsystems.

Thus, although there has been described to this point a particular embodiment for self-timing circuit for use with sneak current cancellation method and apparatus, it is not intended that such specific references be considered as limitations upon the scope of this invention except insofar as set forth in the following claims.

Finally, those of skill in the art will appreciate that the invented method and apparatus described and illustrated herein may be implemented in software, firmware or hardware, or any suitable combination thereof. Preferably, the method and apparatus are implemented in a combination of the three, for purposes of low cost and flexibility. Thus, those of skill in the art will appreciate that the method and apparatus of the invention may be implemented by a computer or microprocessor process in which instructions are executed, the instructions being stored for execution on a computer-readable medium and being executed by any suitable instruction processor. Alternative embodiments are contemplated, however, and are within the spirit and scope of the invention.

Having described and illustrated the principles of the invention in a preferred embodiment thereof, it should be apparent that the invention can be modified in arrangement and detail without departing from such principles. I claim all modifications and variation coming within the spirit and scope of the following claims.

What is claimed is:

1. A sensing method comprising:
   using a reference bit line to difference a charge on a memory cell as between a first and second sense; and
   using the reference bit line also to self-time the second sense, in which a sneak charge diminishes between the first and the second sense,
   wherein the self-timing of the second sense includes adjusting the second sense period to substantially equalize the charge as between the first and the second sense.

2. The method of claim 1, wherein the adjusting is performed using an analog circuit.

3. The method of claim 2 in which an active charge is present on the reference bit line during the first sense, wherein the active charge diminishes substantially to zero prior to the second sense.

4. The method of claim 3, wherein said using of the reference line to difference and to self-time includes one or more analog voltage integrating operations involving a single reference voltage represented by the reference bit line and a bit line voltage representing a memory cell datum and a sneak current during the first sense and representing substantially only the memory cell datum during the second sense.

5. An apparatus comprising:
   a signal path representing a sneak charge of a memory cell bit;
   a subtractor coupled with said signal path to determine a difference between a first sneak charge during a first sense and a second sneak charge during a second sense; and
   a circuit to automatically adjust the second sense to be longer than the first sense in inverse proportion to the determined difference between the first sneak charge and the second sneak charge.

6. The apparatus of claim 5, wherein said signal path is a bit line reference signal path.

7. The apparatus of claim 5, wherein said subtractor is a voltage subtractor.

8. The apparatus of claim 5, wherein said circuit includes an analog circuit.

9. The apparatus of claim 6 in which an active charge is present on said signal path during the first sense, wherein the active charge decays over time and substantially diminishes to zero prior to the second sense.

10. The apparatus of claim 9, wherein said analog circuit includes a threshold generator to produce an adjustable reference voltage, a self-time operational amplifier operatively coupled thereto to produce differential output voltages representative of a difference between the reference voltage and a bit line voltage, a pair of capacitors having first terminals connected in series to said differential output voltages and a comparator to compare voltages present at second terminals of the pair of capacitors to produce a dual-sense timing signal.

11. The apparatus of claim 5, wherein an output voltage level of said subtractor represents a data content of the memory cell bit minus the sneak charge.

12. The apparatus claim 5, wherein the same signal path is used by both said subtractor and said circuit.

13. A system comprising:
   a hard disk memory; and
   a cache memory coupled to the hard disk memory, wherein the cache memory comprises:
   a signal path representing a sneak charge of a memory cell bit;
   a subtractor coupled with the signal path to determine a difference between a first sneak charge during a first sense and a second sneak charge during a second sense; and
   a circuit to automatically adjust the second sense to be longer than the first sense in inverse proportion to the difference between the first sneak charge and the second sneak charge.

14. The system of claim 13, wherein an output voltage level of said subtractor represents a data content of the memory cell bit minus the sneak charge.

15. The system of claim 13, wherein the same signal path is used by both said subtractor and said circuit.

* * * * *